United States Patent
Tourret (10) Patent No.: US 9,548,751 B2
(45) Date of Patent: Jan. 17, 2017

(54) RF CIRCUIT

(71) Applicant: NXP B.V., Eindhoven (NL)

(72) Inventor: Jean-Robert Tourret, Caen (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/821,481

(22) Filed: Aug. 7, 2015

(65) Prior Publication Data

US 2016/0043728 A1    Feb. 11, 2016

(30) Foreign Application Priority Data

Aug. 7, 2014    (EP) .................................. 14290233

(51) Int. Cl.
| | | |
|---|---|---|
| *H03L 7/23* | (2006.01) | |
| *H03L 7/07* | (2006.01) | |
| *H03L 7/099* | (2006.01) | |
| *H03L 7/22* | (2006.01) | |
| *H03L 7/18* | (2006.01) | |
| *H05B 6/00* | (2006.01) | |

(52) U.S. Cl.
CPC ............... *H03L 7/235* (2013.01); *H03L 7/07* (2013.01); *H03L 7/099* (2013.01); *H03L 7/18* (2013.01); *H03L 7/22* (2013.01); *H03L 7/23* (2013.01); *H05B 6/00* (2013.01)

(58) Field of Classification Search
CPC .............. H03L 7/18; H03L 7/07; H03L 7/099; H03L 7/22; H03L 7/23; H03L 7/235; H05B 6/00
USPC ................. 327/105, 107, 147, 150, 156, 159
See application file for complete search history.

(56) References Cited

U.S. PATENT DOCUMENTS

| | | | | | |
|---|---|---|---|---|---|
| 5,856,766 | A | * | 1/1999 | Gillig | ...................... H03L 1/026 327/105 |
| 6,008,704 | A | * | 12/1999 | Opsahl | ................. H03C 3/0925 332/127 |
| 6,833,764 | B1 | * | 12/2004 | Dean | ......................... H03L 7/23 327/156 |
| 9,112,517 | B1 | * | 8/2015 | Lye | ......................... H03L 7/087 |
| 2009/0156150 | A1 | | 6/2009 | Deleon | |
| 2010/0123496 | A1 | * | 5/2010 | Palmer | ...................... H03L 7/07 327/158 |
| 2010/0171648 | A1 | * | 7/2010 | Himmelstoss | ............ G01S 7/35 342/103 |
| 2013/0271186 | A1 | * | 10/2013 | Hossain | .................. H03L 7/235 327/107 |

OTHER PUBLICATIONS

Extended European Search Report for Application 14290233.7 (Nov. 12, 2014).

* cited by examiner

*Primary Examiner* — William Hernandez (57) ABSTRACT

An RF circuit for providing phase coherent signals, an RF heating apparatus comprising the RF circuit and a method for providing phase coherent signals in an RF circuit. The RF circuit has a first frequency synthesiser including a fractional-N phase locked loop and a second frequency synthesiser including an integer-N phase locked loop. An output of the first frequency synthesiser is connected to a phase frequency detector of the integer-N phase locked loop of the second frequency synthesiser via a synchronization signal divider for distributing a synchronization signal from the first frequency synthesiser to the second frequency synthesiser. The integer-N phase locked loop of the second frequency synthesiser comprises a frequency divider of the same modulus as the synchronization signal divider.

18 Claims, 7 Drawing Sheets

RF CIRCUIT

CROSS-REFERENCE TO RELATED APPLICATIONS

This application claims the priority under 35 U.S.C. §119 of European patent application no., filed the contents of which are incorporated by reference herein.

FIELD OF THE INVENTION

This invention relates to an RF circuit. In particular, this invention relates to an RF circuit for providing phase coherent signals.

BACKGROUND OF THE INVENTION

Recent improvements in the manufacture of high power solid state amplifiers have given rise to applications in new fields such as microwave cooking, ignition engine efficiency and in medical devices and treatments.

Conventionally, an RF heating apparatus such as a microwave oven generates RF power to be introduced into a cavity using the device known as a magnetron. A magnetron is an oscillator-amplifier that typically provides RF energy only at a single frequency (for example 2.5 GHz).

The efficiency of the heating provided by a microwave oven is dependent upon the proportion of the RF energy introduced into a cavity of the oven that is actually absorbed by the food or beverage being heated. Normally, at least some of the RF energy introduced into the cavity is reflected back to the magnetron, whereby the power efficiency of the heating apparatus is reduced. It is well known that the reflection of the RF energy inside the cavity depends on factors such as the wavelength, phase and amplitude of the RF radiation, the size, shape and cross section of the food or beverage, and the dimensions and shape of the cavity itself.

Accordingly, it is known that one way to optimise the amount of RF energy that is absorbed by the food or beverage being heated is to trim the physical parameters of the RF radiation, to minimise the reflected signal. These parameters include the amplitude, frequency and/or phase of the radiation. Although a magnetron is a relatively cheap component, it does not allow for this kind of trimming. On the other hand, solid state devices may be able to provide trimming since they can enable multi-frequency, multi-phase operation, with multiple paths.

Figure 1:
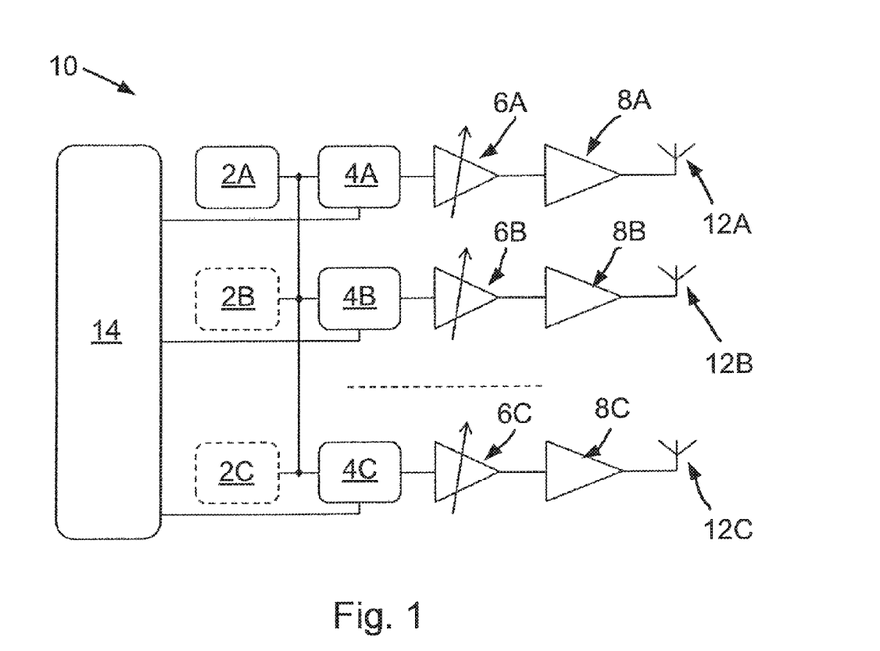
FIG. 1 shows a circuit for generating multi-phase signals for RF energy applications.

FIG. 1 shows an example of an RF circuit 10 including solid state components that can be used to implement trimming of the kind noted above. The circuit 10 includes a plurality of paths A, B, C. Each path includes a phase locked loop (PLL) 2A, 2B, 2C for producing an RF signal. As shown by the dashed lines, the PLLs 2B and 2C may in some examples be disabled (or simply omitted), such that PLL 2A can be used to provide the RF signal for each path. In such examples, the PLL 2A is thus a common PLL that is shared by each path A, B, C, and each path A, B, C would typically operate at the same frequency (i.e. the operating frequency of the PLL 24). Where separate PLLs (e.g. 2A, 2B, 2C) are provided for each path, multi-frequency operation may be enabled.

An output of each PLL 2A, 2B, 2C (or, as noted above, the output of a common or shared PLL 2A) is connected to phase shifters 4A, 4B, 4C. The phase shifters 4A, 4B and 4C can be used to apply the phase shifts to the RF signal of each path under the control of a microcontroller 14. Accordingly, the microcontroller 14 may adjust the phase of each path for trimming the RF radiation produced by the system. Note that the microcontroller 14 may also control the PLLs 2A, 2B, 2C to adjust the frequency of the RF signal in each path A, B, C.

The phase shifted signals are then provided to variable gain amplifiers 6A, 6B, 6C and then to power amplifiers 8A, 8B, 8C for subsequent introduction of RF radiation into the cavity of the heating apparatus by respective antennae 12A, 12B, 12C.

When each path works at the same operating frequency, it is important for the phase between the paths to be accurate and not time varying. Typically, this property can only be achieved if one of the paths provides a phase reference (e.g. a reference signal used by PLL 2A) to each of the other paths so that it is possible to provide phase coherent signals to the phase shifters 4A, 4B, 4C on a local and individual basis without changing the global phase coherence.

Figure 2:
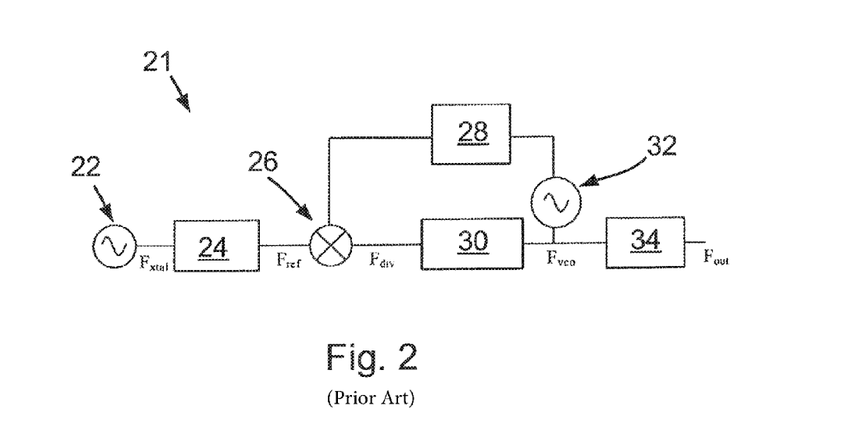
FIG. 2 shows a frequency synthesiser including a phase locked loop.

FIG. 2 shows a frequency synthesiser 21 of the kind that is well known in the art. The frequency synthesiser includes a phase lock loop (PLL) having a voltage controlled oscillator 32 that receives a control signal from a phase frequency detector 26. The control signal provided by the phase frequency detector 26 is typically filtered by a low pass filter 28. The phase frequency detector 26 receives a reference frequency $F_{ref}$ that is produced by a crystal oscillator 22 (VCXO, TCXO, XO . . . etc). If required, the output of the crystal oscillator 22 may be adjusted by a divider 24 to produce the desired frequency of $F_{ref}$. The phase frequency detector 26 also receives a feedback signal $F_{div}$ from a divider 30 that divides the output of the voltage controlled oscillator 32. The control signal produced by the phase frequency detector 26 depends on the relative frequency and phases of the signals $F_{ref}$ and $F_{div}$.

The divider 30 can be an integer-N or a fractional-N divider for producing what are commonly known as integer-N phase lock loops or fractional-N phase lock loops, respectively. In either case, the divider 30 allows the output of the PLL ($F_{vco}$) to be a multiple of $F_{ref}$ ($F_{vco}=N*F_{ref}$ for an integer-N PLL or $F_{vco}=(N+k/q)*F_{ref}$ (where q>k) for a fractional-N PLL).

In some examples, the output of the frequency synthesiser 21 can be provided with a divider 34 which can be used to programmably tune the output frequency $F_{out}$ ($F_{out}=F_{vco}/P$, where P is the modulus of the divider 34).

Figure 3:
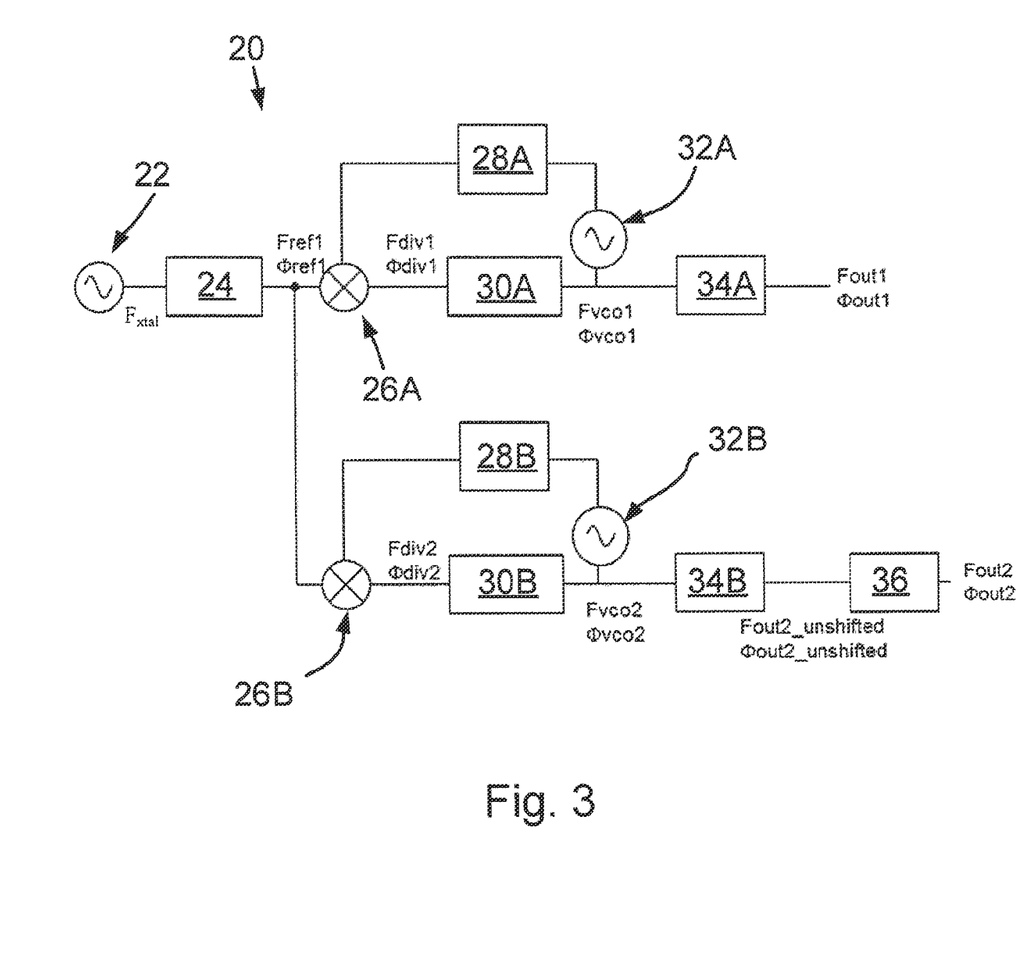
FIGS. 3 to 5 each show an RF circuit including two frequency synthesisers connected together for distribution of a synchronisation signal from the first frequency synthesiser to the second frequency synthesiser.
Figure 4:
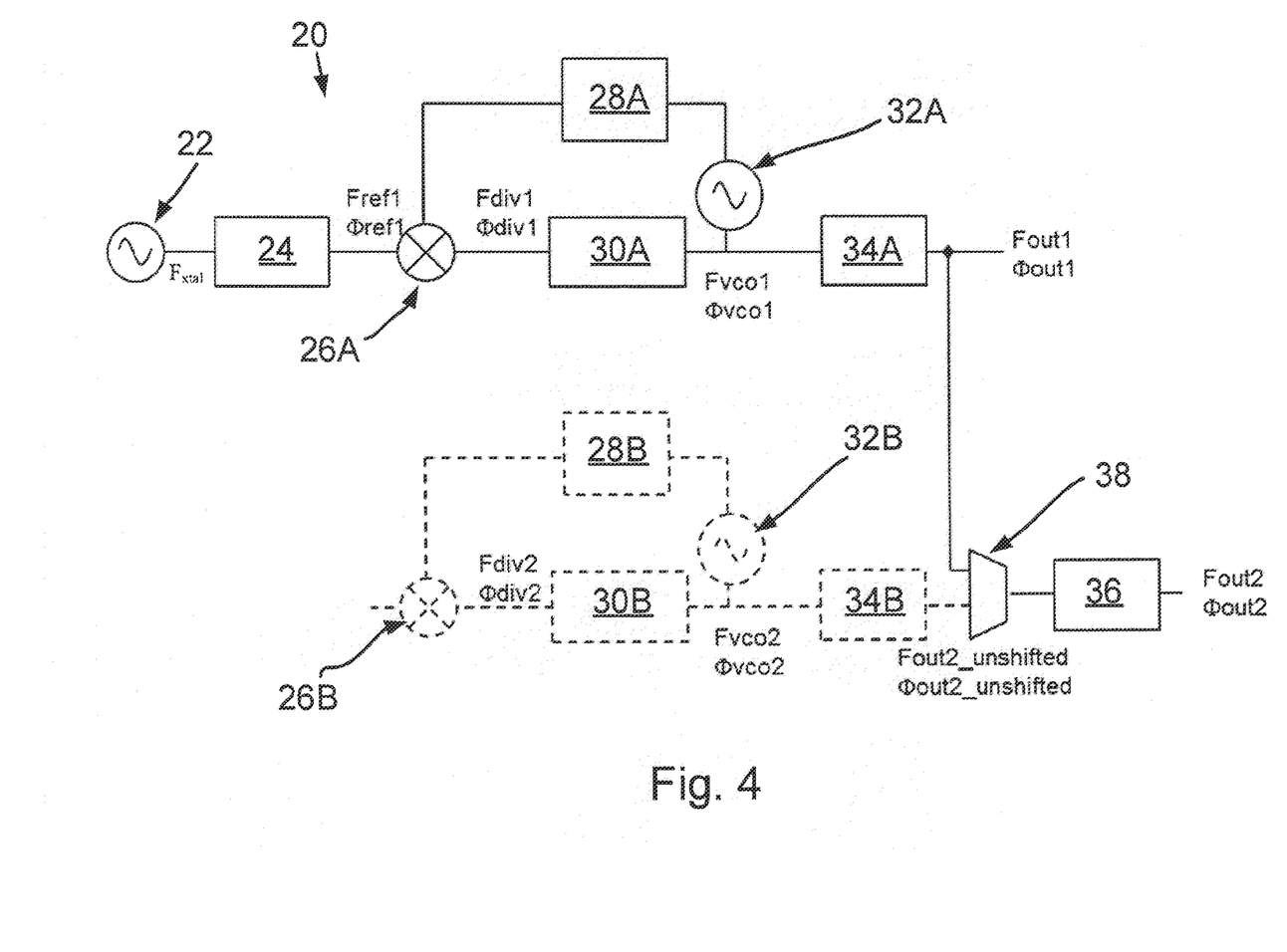
Figure 5:
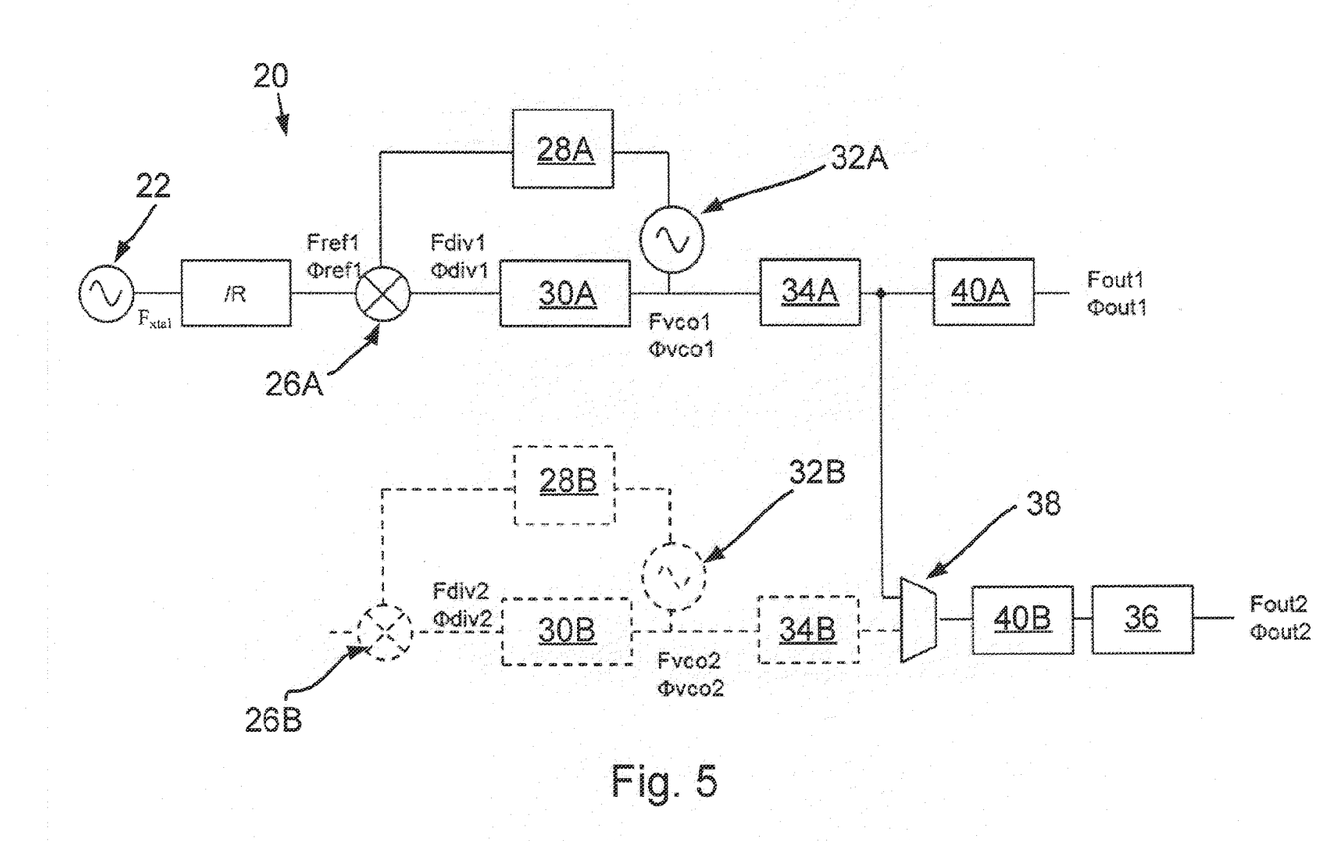

Each of FIGS. 3-5 illustrates examples of how multiple frequency synthesisers can be connected together to allow for the production of multiple RF signals of the kind described required by the arrangement of FIG. 1. In each case, a synchronisation signal can be distributed between the frequency synthesisers for synchronising the frequency and phase of their outputs. The synchronised outputs of the frequency synthesisers can then be used as a starting point for accurate phase trimming, for example in an RF heating apparatus.

In the example of FIG. 3, the RF circuit 20 includes two frequency synthesisers, each including a PLL of the kind noted above in relation to FIG. 2. The frequency synthesisers are both integer-N frequency synthesisers. In this example, each frequency synthesiser includes a divider 34A, 34B for programmably tuning the output frequency $F_{out1}$, $F_{out2}$ as described above. The second frequency synthesiser includes a phase shifter for trimming the output phase of the second frequency synthesiser relative to the output phase of the first frequency synthesiser e.g., in an RF heating apparatus).

In FIG. 3, it is shown that a synchronisation signal is distributed from the first frequency synthesiser to the second frequency synthesiser by simply connecting the output of the crystal oscillator 24 (which may be modified by divider 24) to the phase frequency detectors 26A and 26B of each PLL. The synchronisation signal has frequency $F_{ref1}$ and phase $\phi_{ref1}$.

In the example of FIG. 3, there is a static phase shift between the outputs of the two frequency synthesisers ($F_{out1}$, $\phi_{out1}$; $F_{out2}$, $\phi_{out2}$). This can be deduced as follows:

phase $\phi_{out1}$ is $\phi_{vco1}$ plus the static delay of the divider 34A (where $\phi_{vco1}$ is the phase of the output of the voltage controlled oscillator 32A of the first frequency synthesiser);

the phase at the output of the integer-N divider 30A $\phi_{div1}$ is exactly $\phi_{vco1}/N$;

the phase of the reference signal $\phi_{ref1}$ is $\phi_{div1}$ the PLL is locked;

similarly, the phase at the output of the integer-N divider 30B $\phi_{div2}$ is $\phi_{ref1}$ because the 2nd synthesizer is also locked;

the phase $\phi_{vco2}$ of the output of the voltage controlled oscillator 32B of the second frequency synthesiser is exactly $N*\phi_{div2}$;

the phase at the output of the divider 34B $\phi_{out2\_unshifted}$ is $\phi_{vco2}$ plus the static delay of the divider 34B; and $\phi_{out2}$ is $\phi_{out2\_unshifted}$ plus the static phase inside the phase shifter 36.

As a result, the difference in phase between $\phi$out1 and $\phi$out2 is not known precisely. Nevertheless, the phase difference is generally fixed and time invariant since a phase fluctuation at the output of the first frequency synthesizer will lead to the same phase fluctuation at the output of the second frequency synthesizer.

The example in FIG. 3 has a number of problems associated with it. Firstly, phase noise at the output of the first frequency synthesizer is not correlated to that of the second frequency synthesizer. This can result in jitter between the outputs. Secondly, a circuit using the layout of FIG. 3 must necessarily use integer-N frequency synthesisers because there is no simple, well defined relationship between the phases at the input and output of the divider (e.g. the dividers 30A, 30B in FIG. 3) in a fractional-N PLL. Because the use of an integer-N frequency synthesiser is mandatory, to allow for small changes in the output frequency, $F_{ref1}$ needs to be small ($F_{vco}=N*F_{ref}$). However, a smaller reference frequency is known to produce higher phase noise at the output, so that the arrangement in FIG. 3 is not suitable for low noise applications. It is further noted that integer-N frequency synthesisers tend to have a longer settling time at low frequencies.

In FIG. 4, a synchronisation signal is instead supplied directly from the output of the first frequency synthesiser. As such the dashed portions of the second frequency synthesiser may be disconnected using multiplexer 38 or simply omitted. The multiplexer 38 routes the synchronisation signal directly to the phase shifter 36 for production of a phase trimmed output having frequency $F_{out2}$ and phase $\phi_{out2}$.

Because the synchronisation signal in this example is supplied from the output of the first frequency synthesiser, the only source of uncorrelated noise between each channel arises from the multiplexer 38 and the phase shifter 36. However, the arrangement in FIG. 4 also has a number of problems associated with it. In particular, at high frequencies (e.g. at RF frequencies), distribution of the synchronisation signal (which has the same frequency as the output frequency $F_{out1}$ of the first channel) becomes difficult due to attenuation and loss of frequency and/or phase integrity of the synchronisation signal. These difficulties are particularly troublesome where the physical distance between the channels is large (compared to the wavelength of the signal) so that relatively long distribution paths are required. This can impose unwanted restrictions on the design of, for example, an RF heating apparatus.

In FIG. 5, the arrangement of the channels is similar to that in FIG. 4. In cases where the phase shifter 36 needs an input that is 90° shifted with respect to the signal in the first channel to operate correctly, the divider 34A can be a 2/P divider (where P is an integer), and further dividers 40A and 40B can be provided, which are dividers by 2. In FIG. 5, the synchronisation frequency is even higher than the output frequency $F_{out1}$ of the first channel (e.g. twice), whereby the signal distribution problems noted above are exacerbated. Moreover, it is well known that at start up, dividers-by-2 begin with an unknown phase of +/−180°. This unknown factor means that the phase of the second channel can only be known to within +/−180°, which is generally not acceptable.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided an RF circuit for providing phase coherent signals. The circuit includes a first frequency synthesiser comprising a fractional-N phase locked loop. The circuit also includes a second frequency synthesiser comprising an integer-N phase locked loop. An output of the first frequency synthesiser is connected to a phase frequency detector of the integer-N phase locked loop of the second frequency synthesiser via a synchronisation signal divider for distributing a synchronisation signal from the first frequency synthesiser to the second frequency synthesiser. The integer-N phase locked loop of the second frequency synthesiser comprises a frequency divider of the same modulus as the synchronisation signal divider.

According to another aspect of the invention, there is provided a method for providing phase coherent signals in an RF circuit. The method includes providing a first frequency synthesiser comprising a fractional-N phase locked loop and at least one other frequency synthesiser comprising an integer-N phase locked loop. The method also includes distributing a synchronisation signal from the first frequency synthesiser to each other frequency synthesiser in the RF circuit by supplying an output signal of the first frequency synthesiser to a phase frequency detector of the integer-N phase locked loop of each other frequency synthesiser via a synchronisation signal divider. The integer-N phase locked loop of each other frequency synthesiser comprises a frequency divider of the same modulus as the synchronisation signal divider.

Embodiments of this invention can provide an RF circuit in which phase coherent signals are produced by multiple frequency synthesisers. In particular, a first frequency synthesiser of the RF circuit can be a fractional-N PLL, allowing for small frequency steps during operation. A synchronisation signal can be distributed to a second frequency synthesiser of the RF circuit in a manner that overcomes the above mentioned problems relating to the lack of a simple, well defined relationship between the input and the output of the main divider of a fractional-N PLL. Additionally, the synchronisation signal divider may allow the synchronisation signal to be distributed at a lower frequency than the output frequency of the first frequency synthesiser, which may simplify the distribution task by alleviating the above noted problems relating to attenuation and loss of coherence, particularly for longer distribution paths.

The synchronisation signal divider and the frequency divider may be static dividers. As such, the static phase delay introduced by the dividers may be small and well controlled and neither may suffer from the above described problems associated with the use of fractional-N dividers. In one embodiment, a frequency of the synchronisation signal $F_{chain}$ is lower than an output frequency $F_{out}$ of the first frequency synthesiser. The lower frequency may be achieved using the synchronisation signal divider.

In some embodiments, the output of the first frequency synthesiser is provided with a tuning divider. The tuning divider can be used to divide (e.g. by a factor of P, where P is an integer) the output frequency of the RF signal produced by the first frequency synthesiser for extending a tuning range of the first frequency synthesiser. In such examples, the synchronisation signal may be provided from the output of the first frequency synthesiser as tuned by the tuning divider. To account for the operation of the tuning divider, which may otherwise produce an undesired increase in the frequency of the synchronisation signal, the synchronisation signal divider and the frequency divider may both configured to divide by a multiple of 1/P. Additionally, the output of the second frequency synthesiser may be provided with a tuning divider to divide the output of the second frequency synthesiser by the same factor (e.g. P) applied by the tuning divider of the first frequency synthesiser.

In some examples, the circuit may include more than two frequency synthesisers, allowing flexibility in the design of for example, an RF heating apparatus. Thus in one embodiment, one or more further frequency synthesisers may be provided, each comprising an integer-N phase locked loop. The output of the first frequency synthesiser may be connected to a phase frequency detector of the integer-N phase locked loop of each further frequency synthesiser via a synchronisation signal divider for distributing a synchronisation signal from the first frequency synthesiser to the second frequency synthesiser. The integer-N phase locked loop of each further frequency synthesiser may include a frequency divider of the same modulus as the synchronisation signal divider. Accordingly, each further frequency synthesisers may be similar in configuration to the second frequency synthesiser, and may also be connected to the first frequency synthesiser in a similar manner.

In such examples, the synchronisation signal divider may be a common divider connected to the phase frequency detector of the integer-N phase locked loop of the second frequency synthesiser and each further frequency synthesiser. Alternatively, a separate, respective synchronisation signal divider can be provided for each of the second and further frequency synthesisers. For some applications, provision of a common synchronisation signal divider may reduce uncertainty as to the noise introduced by the distribution of the synchronisation signal, since variations between the noise produced by multiple separate synchronisation signal dividers need not be accounted for.

Where multiple frequency synthesisers are provided, they may be connected together using various topologies. In one example, a daisy chain topology may be used. However, the low frequency of the synchronisation frequency also enables a star topology to be used. Thus, in one embodiment, the second frequency synthesiser and each further frequency synthesiser may be connected to the first frequency synthesiser in a star topology. The use of a star topology may avoid problems associated with additional noise being added by each stage in the chain of a daisy chain topology.

In one embodiment, an output of the second frequency synthesiser and/or each further frequency synthesiser may be provided with a phase shifter for controllably trimming the phase of the output signal of the second frequency synthesiser and/or each further frequency synthesiser relative to the phase of the output signal of the first frequency synthesiser. This can enable trimming of multiple RF signals in, for example, an RF heating apparatus.

In some examples, at least two of the frequency synthesisers may be located on separate semiconductor dies. When the frequency synthesisers are provided on separate dies (note that the dies themselves may be located separately, e.g. on separate PCBs) they may require relatively long signal paths for distributing the synchronisation signal. In such examples, the benefits of using a low frequency synchronisation signal (e.g. lower than the output frequency of the first frequency synthesiser) are emphasised.

According to a further aspect of the invention, there is provided an RF heating apparatus comprising an RF circuit of the kind described above.

For the purposes of this application, RF frequencies are considered to be frequencies in the range $100 \text{ MHz} \leq f \leq 10 \text{ GHz}$. In some examples, frequencies falling within ISM bands may be used. These frequencies may find particular in given applications or fields. For instance the ISM band 433.05-434.790 MHz may be used for RF lighting applications and the ISM bands 902-928 MHz and 2.4-2.5 GHz may be used for RF heating applications.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference the accompanying drawings.

Embodiments of this invention can provide an RF circuit for providing phase coherent signals. In some examples, these signals can be provided in multiple channels, each channel having a frequency synthesiser. As noted above, embodiments of this invention can enable the use of a fractional-N frequency synthesiser in a first channel of the circuit, which can provide for small adjustments in the output frequency. Embodiments of this invention allow a synchronisation signal to be distributed from the first frequency synthesiser to one or more other frequency synthesisers that can be provided in other channels of the circuit in a manner that allows the above-noted problems relating to uncertainty of the phase of the signal on either side of a fractional divider to be avoided.

Moreover, and as described in more detail below, the synchronisation signal can be distributed in a manner that allows the synchronisation signal itself to have a lower frequency than, for example, the output frequency of the first frequency synthesiser. The relatively low frequency of the synchronisation signal can, in some examples, ease the task of distributing the synchronisation signal to the other frequency synthesiser(s) of the circuit. In particular, it is known in the art that the distribution of RF signals suffers from a greater degree of attenuation and loss of phase coherence than the distribution of relatively low frequency signals, particularly where the distribution paths are long. Accordingly, embodiments of this invention provide additional design freedom for devices such as an RF heating apparatus, in which frequency synthesisers may be provided on separate semiconductor dies or even on separate printed circuit boards (PCBs) located in different parts of the RF heating apparatus.

Figure 6:
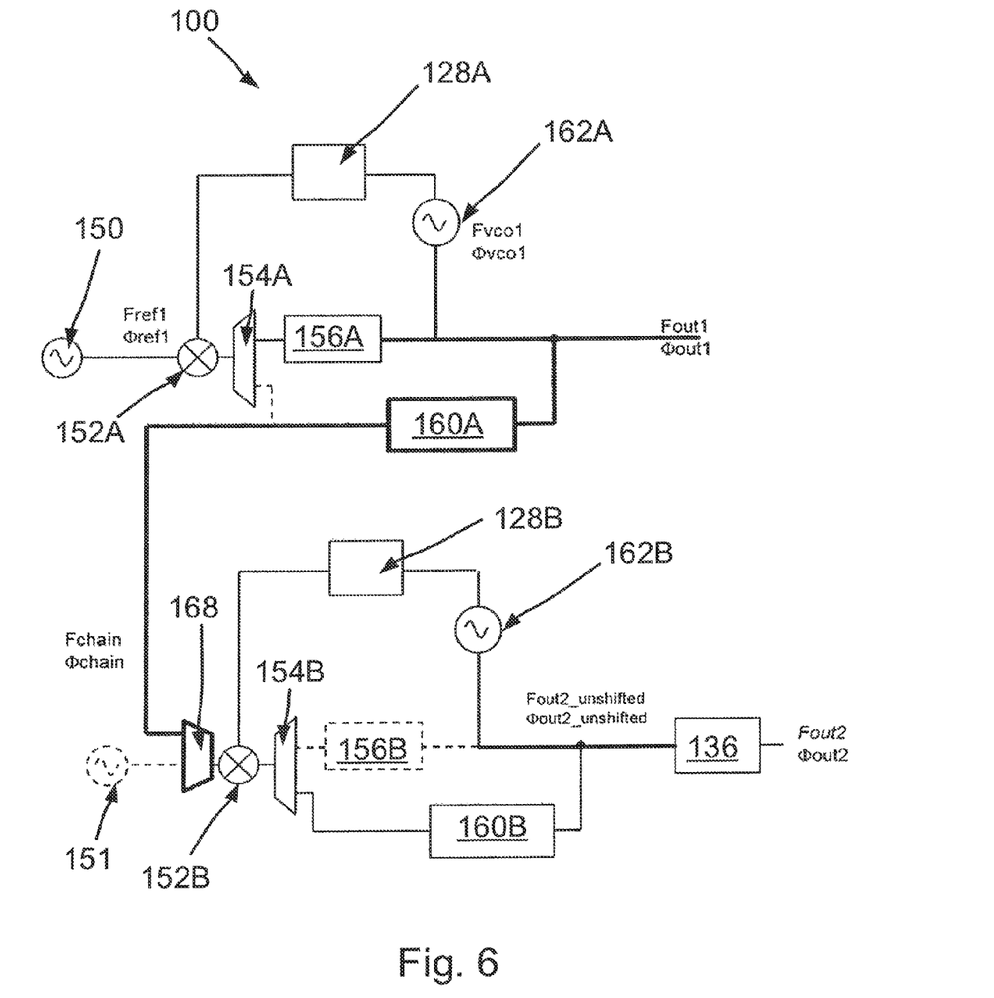
FIG. 6 shows an RF circuit in accordance with an embodiment of the invention.

A first embodiment of an RF circuit 100 for providing phase coherent signals is shown in FIG. 6. In this embodiment, the RF circuit 100 includes a first frequency synthesiser having a phase locked loop (PLL) including a divider 156A, a low pass filter 128A and a voltage controller oscillator 162A. The divider 156A of the PLL is a fractional-N divider (which divides by (N+k/q), where N, k, q are integers). The PLL of the first frequency synthesiser receives a reference signal from an oscillator 150 which may be a crystal oscillator (VCXO, TCXO, XO, etc.). As described above in relation to, for example, FIG. 3, in some examples a divider can be placed between the oscillator 150 and the PLL for appropriate division of the output of the oscillator 150 if desired.

The PLL of the first frequency synthesiser also includes a phase frequency detector 152A. In operation, the phase frequency detector 152A outputs a signal that (assuming that the frequencies input to the phase frequency detector 152A are equal) is indicative of the difference in phase between the reference signal output by the oscillator 150 ($\phi_{ref1}$) and the feedback signal received from the divider 156A. The output of the phase frequency detector 152A is smoothed by the low pass filter 128A before being applied as a control signal to the voltage controller oscillator 162A. As is well known in the art, the PLL locks the output of the frequency synthesiser to a multiple (N+k/q) of the output of the oscillator 150. The output of the first frequency synthesiser shown in FIG. 6 has a frequency $F_{out1}$ and a phase $\phi_{out1}$.

In FIG. 6, the RF circuit also includes a second frequency synthesiser which includes a PLL having a phase frequency detector 152B, a low pass filter 128B, a voltage controlled oscillator 162B and a frequency divider 160B. As will be described in more detail below, the first frequency synthesiser is connected to the second frequency synthesiser through a synchronisation signal divider 160A for distribution of a synchronisation signal having frequency $F_{chain}$ and phase $\phi_{chain}$ from an output of the first frequency synthesiser to the phase frequency detector 152B of the second frequency synthesiser.

The components indicated by the dashed lines in FIG. 6 are not enabled in accordance with embodiments of this invention but, for illustrative purposes only, are included here to demonstrate that the multiple frequency synthesisers of RF circuit herein can be produced on a semiconductor die using a repeated set of components, some of which can be enabled and others of which can be disabled to achieve the desired functionality. This is a common practice and will be understood by the person skilled in the art. Various multiplexers 154A, 168 and 145B are provided in order to disable the unneeded features. In FIG. 6 these features include, for example, a crystal oscillator 151 of the second frequency synthesiser, a fractional-N divider 156B of the second frequency synthesiser and a connection between the output of the divider 160A and the phase frequency detector 152A of the first frequency synthesiser. In some implementations, these features may be omitted completely, whereby there would be no need to include the multiplexers 154A, 168 and 145B.

The second frequency synthesiser can, in some embodiments, also include a phase shifter 136 for applying a phase shift to the output of the second frequency synthesiser. The output of the second frequency synthesiser has a frequency $F_{out2}$ and a phase $\phi_{out1}$. The output of the second frequency synthesiser prior to the application of a phase shift by the phase shifter 136 has a frequency $F_{out2\_unshifted}$ and a phase $\phi_{out2\_unshifted}$. The phase shifter 136 can be used for trimming the output of the second frequency synthesiser relative to the output of the first frequency synthesiser.

The PLL of the second frequency synthesiser is an integer-N PLL. Thus the divider 160B of the second frequency synthesiser is an integer-N divider. The synchronisation signal in this embodiment is distributed from an output of the first frequency synthesiser and provided to the phase frequency detector 152B of the second frequency synthesiser via the divider 160A. In accordance with an embodiment of this invention, the divider 160A has the same modulus as the divider 160B of the PLL of the second frequency synthesiser. Thus, the divider 160A is also an integer-N divider. The matching of the two dividers 160A and 160B in this way provides for an output frequency $F_{out2}$ of the second frequency synthesiser that is the same as the output frequency $F_{out1}$ of the first frequency synthesiser, since the inputs of the phase frequency detector 152B received from the synchronisation signal divider 160A and the divider 160B of a second frequency synthesiser will be matched.

The unshifted output phase of the second frequency synthesiser $\phi_{out2\_unshifted}$ will be approximately the same as the output phase $\phi_{out1}$ of the first frequency synthesiser, although some static delays will typically be introduced by the two dividers 160A and 160B. The dividers 160A and 160B can be static dividers (integer-N), in which case the static delay produced by these dividers can be relatively small and well defined. Thus, it is possible to distribute the reference signal in such a manner as to produce only a small, well defined phase error at the output of the second frequency synthesiser, even though the first frequency synthesiser employs a fractional-N PLL.

Moreover, the synchronisation signal divider 160A may also act to lower the frequency of the synchronisation signal by dividing the frequency of the output of a first frequency synthesiser to produce a synchronisation signal having a frequency $F_{chain} < F_{out1}$. As described herein, because the synchronisation signal is relatively low frequency, the practical difficulties involved in distributing a synchronisation signal to the second frequency synthesiser are alleviated.

Figure 7:
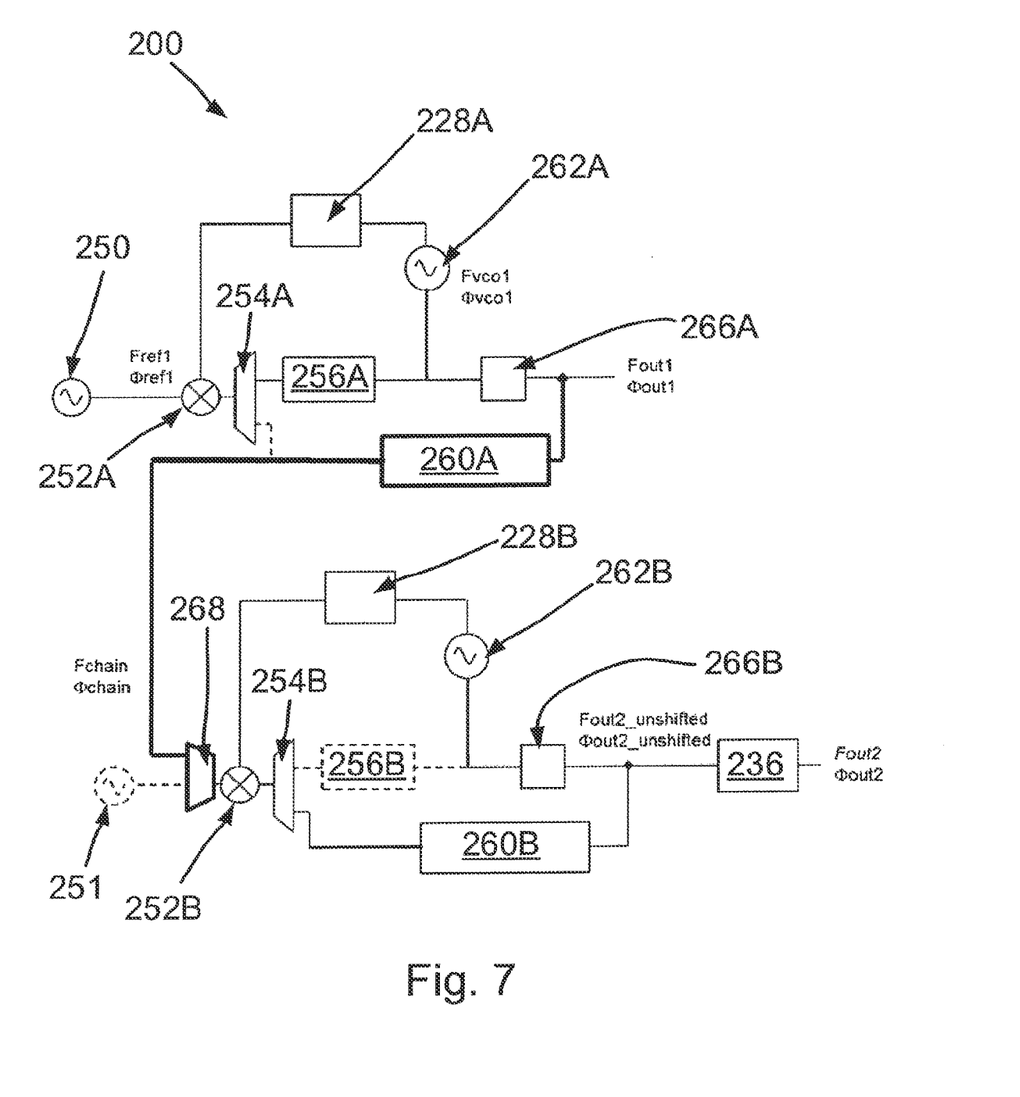
FIG. 7 Shows another RF circuit in accordance with an embodiment of the invention.

FIG. 7 shows an RF circuit according to another embodiment of this invention. The components and operation of this embodiment are substantially similar to those described above in relation to FIG. 6, except as described below.

In the embodiment of FIG. 7, the first frequency synthesiser of the RF circuit is provided with a first tuning divider 266A while the second frequency synthesiser is provided with a tuning divider 266B. Each tuning divider 266A, 266B is operable to divide the output of the PLL of each frequency synthesiser by a factor P (where P is an integer) in order to extend the tuning range of the frequency synthesisers.

As shown in FIG. 7, the synchronisation signal is provided from the output of the first frequency synthesiser after the output has been tuned by the tuning divider 266A. The tuning divider 266B of second frequency synthesiser is configured to divide the output of the PLL of the second frequency synthesiser by the same factor (P) by which the tuning divider 266A divides the output of the PLL of the first frequency synthesiser. To account for the change in output frequency produced by the tuning divider 266A and to ensure that the respective output of each frequency synthesiser $F_{out1}$ and $F_{out2}$ are equal, the dividers 260A and 260B are both configured to divide their input by a factor of 1/P. For example, since the synchronisation signal divider 260A and the frequency divider 260B of the PLL of the second frequency synthesiser are both, in this embodiment, integer-N dividers, the factor by which each divider divides its input signal will accordingly be N/P.

Accordingly, the embodiment of FIG. 7 allows for the provision of a tuning divider in each frequency synthesiser while still allowing correct operation of the synchronisation signal divider 260A for distributing an appropriate synchronisation signal to the second frequency synthesiser.

It is envisaged that where tuning dividers such as dividers 266A and 266B are provided, the synchronisation signal divider may alternatively be connected to the first frequency synthesiser before the tuning divider 266A (namely in between the voltage controlled oscillator 262A and the tuning divider 266A). In this alternative example, the divider 260B should also be connected between the voltage controlled oscillator 262B and the tuning divider 266B. In this alternative example, because the synchronisation signal does not take into account the phase shift associated with the tuning divider 266A and does not therefore take into account the unknown start-up phase of the divider 266A, separate provision would need to be made for correcting for this unknown phase at start-up of the circuit. In contrast, the arrangement shown in FIG. 7 does not exhibit this problem because the synchronisation signal is tapped from a point in the first frequency synthesiser after the tuning divider 266A, whereby its phase is factored in to the phase of the synchronisation signal.

The examples shown in FIGS. 6 and 7 include a first frequency synthesiser and a second frequency synthesiser. However, as noted herein, it is envisaged that further frequency synthesisers could be included in the RF circuit. In particular, it is envisaged that in addition to the second frequency synthesiser shown in FIGS. 6 and 7, further frequency synthesisers could also be connected to the first frequency synthesiser for receiving a synchronisation signal therefrom in a manner similar to that described above. Each further frequency synthesiser can be configured to include the same components as the second frequency synthesiser and can also be connected to the first frequency synthesiser through a divider such as divider 160A or 260A as described above.

To distribute the synchronisation signal between the first frequency synthesiser and the multiple other frequency synthesisers (including the second frequency synthesiser and the further frequency synthesisers) a number of different approaches are envisaged. For example, and with reference to FIGS. 6 and 7, a single common synchronisation signal divider such as divider 160A or divider 260A could be used to create a common synchronisation signal that can then be distributed to each of the other frequency synthesisers. This has the advantage that each of the other frequency synthesisers receives the same synchronisation signal having the same noise characteristics. In an alternative embodiment, it is envisaged that a separate synchronisation divider could be provided for each of the other frequency synthesisers. A disadvantage of this approach might be that the plurality of separate synchronisation signal dividers may each have different noise characteristics, whereby differences in noise (for example phase noise) between the various different distribution paths of the synchronisation signal may arise.

Figure 8A:
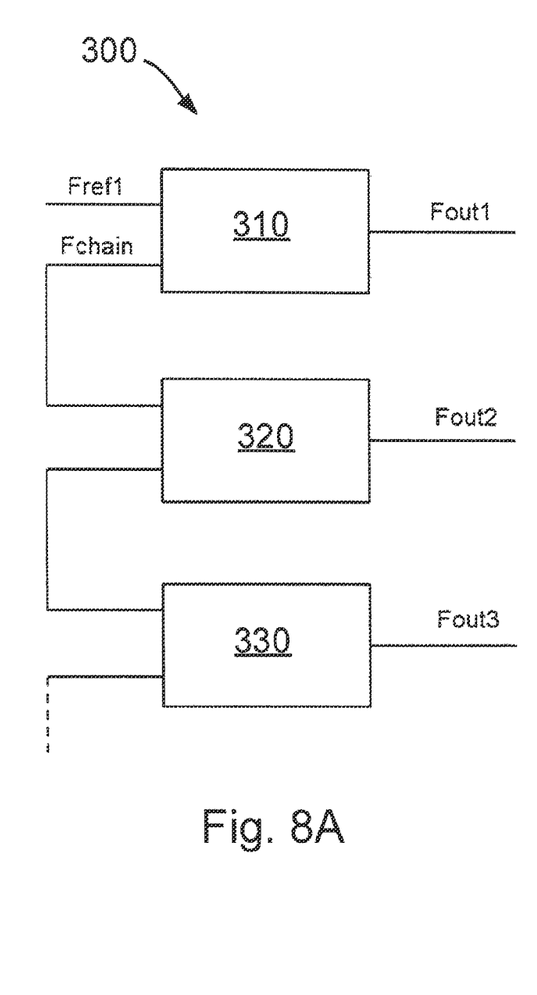
FIG. 8A shows an RF circuit including a plurality of frequency synthesisers connected together in a daisy chain topology in accordance with an embodiment of the invention.

Different topologies for the distribution of the synchronisation signal are also envisaged. For example, FIG. 8A shows the distribution of the synchronisation signal using a daisy-chain topology. In FIG. 8A an RF circuit 300 includes a first frequency synthesiser 310, a second frequency synthesiser 320 and one or more further frequency synthesisers such as frequency synthesiser 330. The first frequency synthesiser receives a reference signal having frequency $F_{ref1}$, for example from an oscillator as described above in relation to FIGS. 6 and 7. The first frequency synthesiser 310 uses this signal to generate its output having frequency $F_{out1}$. A synchronisation signal having frequency $F_{chain}$ is then passed on to the second frequency synthesiser 320, which uses the synchronisation signal to produce its output having frequency $F_{out2}$. The synchronisation signal is then passed from the second frequency synthesiser 320 to the further frequency synthesiser 330 and so on. In each case, the synchronisation signal having frequency $F_{chain}$ is derived from the output of the corresponding frequency synthesiser ($F_{out1}$, $F_{out2}$, $F_{out3}$ and so on). Because of this, a disadvantage with the approach taken in FIG. 8A is that noise in the synchronisation signal can accumulate with each successive point on the daisy chain.

While daisy chain topologies are well suited for high operating chaining frequencies, the fact that embodiments of this invention can use a relatively low synchronisation signal frequency $F_{chain}$ in enables the use of a star topology. An example of this is shown in FIG. 8B.

Figure 8B:
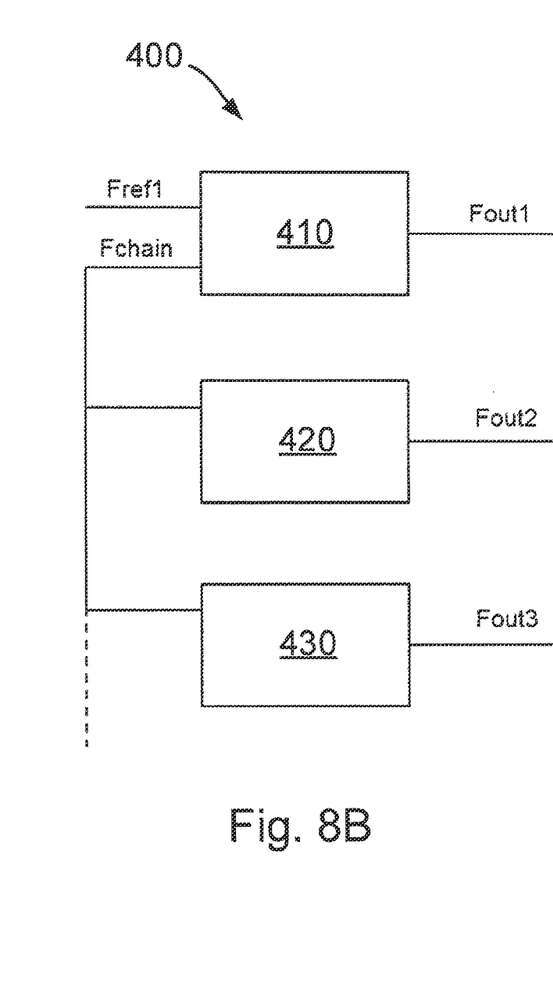
FIG. 8B shows an RF circuit including a plurality of frequency synthesisers connected together in a star topology in accordance with an embodiment of the invention.

In FIG. 8B, an RF circuit 400 includes a first frequency synthesiser 410, a second frequency synthesiser 420 and at least one further frequency synthesiser 430. The first frequency synthesiser 410 receives a reference signal, for example from an oscillator having frequency $F_{ref1}$ and uses this reference signal to generate its output having a frequency $F_{out1}$. The synchronisation signal in this embodiment is then passed directly to each of the second and further frequency synthesisers. Accordingly, the second frequency synthesiser 420 and each further frequency synthesiser receives the synchronisation signal directly and not via any intervening frequency synthesisers. In this way, it can be ensured that each of the second and further frequency synthesisers receives a synchronisation signal having the same or similar characteristics (for example, in terms of phase noise).

Embodiments of this invention may find application wherever there is a need to create phase coherent signals in an RF circuit. Embodiments of this invention find particular application where the respective frequency synthesisers of an RF circuit are distributed (for example, not provided on the same semiconductor die), in which case synchronisation between the frequency synthesisers can become problematic at relatively high output frequencies (for example, RF frequencies).

According to an embodiment of the invention, there can be provided an RF heating apparatus (such as a microwave oven) which incorporates an RF circuit of the kind described herein. The RF circuit can provide for close control of the frequency of the RF radiation introduced into the cavity of such an RF heating apparatus (owing to the provision of the fractional-N phase lock loop in the first frequency synthesiser), while also ensuring phase coherence between the frequency synthesisers of each of a plurality of channels of the RF heating apparatus. This phase coherence can provide a well-defined set of outputs prior to trimming.

Accordingly, there has been described an RF circuit for providing phase coherent signals, an RF heating apparatus comprising the RF circuit and a method for providing phase coherent signals in an RF circuit. The RF circuit has a first frequency synthesiser including a fractional-N phase locked loop and a second frequency synthesiser including an integer-N phase locked loop. An output of the first frequency synthesiser is connected to a phase frequency detector of the integer-N phase locked loop of the second frequency synthesiser via a synchronisation signal divider for distributing a synchronisation signal from the first frequency synthesiser to the second frequency synthesiser. The integer-N phase locked loop of the second frequency synthesiser comprises a frequency divider of the same modulus as the synchronisation signal divider.

Although particular embodiments of the invention have been described, it will be appreciated that many modifications/additions and/or substitutions may be made within the scope of the claimed invention.

The invention claimed is:

1. An RF circuit for providing phase coherent signals, the circuit comprising:
    a first frequency synthesiser comprising a fractional-N phase locked loop; and
    a second frequency synthesiser comprising an integer-N phase locked loop;
    wherein an output of the first frequency synthesiser is connected to a phase frequency detector of the integer-N phase locked loop of the second frequency synthesiser via a synchronisation signal divider for distributing a synchronisation signal from the first frequency synthesiser to the second frequency synthesiser,
    wherein the integer-N phase locked loop of the second frequency synthesiser comprises a frequency divider of a same modulus as the synchronisation signal divider; and
    wherein an output of the second frequency synthesiser is provided with a phase shifter for controllably trimming the phase of the output signal of the second frequency synthesiser relative to the phase of the output signal of the first frequency synthesiser.

2. The RF circuit of claim 1,
    wherein the synchronisation signal divider and the frequency divider are static dividers.

3. The RF circuit of claim 1,
    wherein a frequency of the synchronisation signal Fchain is lower than an output frequency Fout of the first frequency synthesiser.

4. The RF circuit of claim 1,
    wherein the output of the first frequency synthesiser is provided with a tuning divider for extending a tuning range of the first frequency synthesiser,
    wherein the synchronisation signal comprises the output of the first frequency synthesiser as tuned by the tuning divider.

5. The RF circuit of claim 4,
    wherein the tuning divider is operable to divide by P, where P is an integer, and wherein the synchronisation signal divider and the frequency divider are both configured to divide by a multiple of 1/P.

6. The RF circuit of claim 1
    comprising one or more further frequency synthesisers each comprising an integer-N phase locked loop,
    wherein the output of the first frequency synthesiser is connected to a phase frequency detector of the integer-N phase locked loop of each further frequency synthesiser via a synchronisation signal divider for distributing a synchronisation signal from the first frequency synthesiser to each further frequency synthesiser, and
    wherein the integer-N phase locked loop of each further frequency synthesiser comprises a frequency divider of the same modulus as the synchronisation signal divider.

7. The RF circuit of claim 6,
    wherein the synchronisation signal divider is a common divider connected to the phase frequency detector of the integer-N phase locked loop of the second frequency synthesiser and each further frequency synthesiser.

8. The RF circuit of claim 6 comprising
    a respective synchronisation signal divider for connecting the output of the first frequency synthesiser to the phase frequency detector of each respective phase locked loop of the second frequency synthesiser and each further frequency synthesiser.

9. The RF circuit of claim 6,
    wherein the second frequency synthesiser and each further frequency synthesiser are connected to the first frequency synthesiser in a star topology.

10. The RF circuit of claim 1
    wherein the first and second frequency synthesisers are located on separate semiconductor dies.

11. An RF heating apparatus comprising
    the RF circuit of claim 1.

12. A method for providing phase coherent signals in an RF circuit, the method comprising:
    providing a first frequency synthesiser comprising a fractional-N phase locked loop and at least one other frequency synthesiser comprising an integer-N phase locked loop;
    distributing a synchronisation signal from the first frequency synthesiser to each of the other frequency synthesisers in the RF circuit by
        supplying an output signal of the first frequency synthesiser to a phase frequency detector of the integer-N phase locked loop of each of the other frequency synthesisers via a synchronisation signal divider,
    wherein the integer-N phase locked loop of each of the other frequency synthesisers comprises a frequency divider of a same modulus as the synchronisation signal divider; and
    trimming the phases of the output signals provided by each of the other frequency synthesisers with respect to the phase of the output of the first frequency synthesiser.

13. The method of claim 12 comprising
distributing the synchronisation signal from the first frequency synthesiser to each of the other frequency synthesisers in the RF circuit using a star topology.

14. An RF circuit for providing phase coherent signals, the circuit comprising:
a first frequency synthesiser comprising a fractional-N phase locked loop; and
a second frequency synthesiser comprising an integer-N phase locked loop;
wherein an output of the first frequency synthesiser is connected to a phase frequency detector of the integer-N phase locked loop of the second frequency synthesiser via a synchronisation signal divider for distributing a synchronisation signal from the first frequency synthesiser to the second frequency synthesiser, and
wherein the integer-N phase locked loop of the second frequency synthesiser comprises a frequency divider of a same modulus as the synchronisation signal divider; and
wherein the synchronisation signal divider and the frequency divider are static dividers.

15. The RF circuit of claim 14:
wherein a frequency of the synchronisation signal Fchain is lower than an output frequency Fout of the first frequency synthesiser.

16. The RF circuit of claim 14:
wherein an output of the second frequency synthesiser is provided with a phase shifter for controllably trimming the phase of the output signal of the second frequency synthesiser relative to the phase of the output signal of the first frequency synthesiser.

17. The RF circuit of claim 14:
wherein the first and second frequency synthesisers are located on separate semiconductor dies.

18. An RF heating apparatus comprising
the RF circuit of claim 14.

* * * * *